United States Patent
Lee et al.

(10) Patent No.: US 7,064,051 B2
(45) Date of Patent: Jun. 20, 2006

(54) METHOD OF FORMING SELF-ALIGNED CONTACT PADS OF NON-STRAIGHT TYPE SEMICONDUCTOR MEMORY DEVICE

(75) Inventors: Eun-Mi Lee, Gyeonggi-do (KR); Doo-Hoon Goo, Gyeonggi-do (KR); Jung-Hyeon Lee, Gyeonggi-do (KR); Gi-Sung Yeo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/944,151

(22) Filed: Sep. 16, 2004

(65) Prior Publication Data

US 2005/0070080 A1 Mar. 31, 2005

(30) Foreign Application Priority Data

Sep. 29, 2003 (KR) .................... 10-2003-0067433

(51) Int. Cl.
*H01L 21/3205* (2006.01)
*H01L 21/4763* (2006.01)

(52) U.S. Cl. ..................... 438/587; 438/588

(58) Field of Classification Search .......... 438/587, 438/588, 591, 238, 239, 622, 629
See application file for complete search history.

(56) References Cited

U.S. PATENT DOCUMENTS

| | | | |
|---|---|---|---|
| 5,194,752 A | 3/1993 | Kumagai et al. | |
| 5,305,252 A | 4/1994 | Saeki | |
| 6,031,262 A | 2/2000 | Sakao | |
| 6,242,332 B1* | 6/2001 | Cho et al. | ................ 438/587 |
| 2005/0035387 A1* | 2/2005 | Lee et al. | ................ 257/296 |

FOREIGN PATENT DOCUMENTS

| | | |
|---|---|---|
| JP | 2000-208394 | 7/2000 |
| KR | 10-0214524 | 5/1999 |
| KR | 2003-0056712 | 2/2005 |

OTHER PUBLICATIONS

English language abstract of Korean Patent Application No. 2003-0056712.
English language abstract of Korean Publication No. 10-0214524.
English language abstract of Japanese Publication No. 2000-208394.

* cited by examiner

*Primary Examiner*—Walter L. Lindsay, Jr.
(74) *Attorney, Agent, or Firm*—Marger Johnson & McCollom, P.C.

(57) ABSTRACT

Embodiments of the invention provide methods of forming SAC pads in non-straight semiconductor device having non-straight type or separate type active regions. A plurality of gate line structures extending in one direction may be formed on a semiconductor substrate having non-straight active regions. An interlayer insulating layer covering gate line structures may be formed on the gate line structures. Then, a photo-resist layer may be formed on the interlayer insulating layer. A photo-resist pattern may be formed through exposing and developing the photo-resist layer by using a photo-mask having, for example, a bar type, a wave type, or a reverse active type pattern. Then, contact holes exposing source/drain regions may be formed by etching the interlayer insulating layer using the photo-resist pattern as an etching mask. Contact pads may then be formed by filling the contact holes with a conductive material.

15 Claims, 9 Drawing Sheets

METHOD OF FORMING SELF-ALIGNED CONTACT PADS OF NON-STRAIGHT TYPE SEMICONDUCTOR MEMORY DEVICE

CROSS REFERENCE TO RELATED APPLICATIONS

This application claims priority from Korean (KR) Patent Application No. 2003-67433, filed on 29 Sep. 2003, the content of which is hereby incorporated by reference in its entirety for all purposes.

BACKGROUND OF THE INVENTION

1. Field of the Invention

This disclosure relates to a method of forming contact pads of a semiconductor device, and more particularly, to a method of forming self-aligned contact (SAC) pads connected to source regions and drain regions of a semiconductor memory device.

2. Description of the Related Art

In accordance with the increase in storage capacity of semiconductor memory devices, especially DRAM, 256 Megabit DRAM are now commonly used and Gigabit DRAM is being prepared for mass production. For these high capacity devices and others like them, various layouts for memory cells have been suggested in order to decrease the design rule. Presently, straight type layouts and non-straight type layouts are widely used as layouts of active regions in memory cells. Examples of non-straight type layouts are disclosed in U.S. Pat. Nos. 5,194,752, 5,305,252, and 6,031,262.

FIG. 1 is a layout diagram illustrating non-straight type active regions and word lines of a conventional semiconductor DRAM device. Referring to FIG. 1, a plurality of non-straight type active regions 10 having identical patterns are repetitively arranged. Two of the word lines 15, which are formed by gate line structures across a single active region 10, divide the active region 10 into three parts. The outer portions A of the active region 10 are source regions and the central portion B is a common drain region. The source regions A are connected to a lower capacitor electrode (not shown) via a storage node contact pad (not shown) and the common drain region B is connected to a bit line (not shown) via a bit line contact pad (not shown).

A storage node contact pad and a bit line contact pad (contact pad) are formed between adjacent gate line structures 15. The contact pad is formed inside an interlayer insulating layer between adjacent gate line structures 15. A self-aligned etching process is used to form the contact pad. One example of the etching process will be described as follows.

First, an interlayer insulating layer is formed of silicon oxide over the entire surface of a semiconductor substrate. Gate electrode structures 15, which act as word lines, have been formed on the surface of the semiconductor substrate. Covering the upper surface and side of each gate electrode structure is a hard mask and a spacer composed of silicon nitride. Source regions A and a common drain region B (source/drain regions) have also been formed in the semiconductor substrate.

Next, contact holes exposing the source/drain regions A and B are formed, using a photolithography process. That is, a photo-resist is coated on the interlayer insulating layer, exposed by using a photo-mask on which a predetermined pattern is formed, and is developed so as to form a photo-mask pattern. Contact holes are generated by etching the interlayer insulating layer using the photo-mask pattern as an etching mask. Then, the contact holes are filled with conductive materials. Contact pads are formed by separating nodes from the conductive materials by a method such as etch back. A SAC pad forming method is conventionally used to form the contact pads.

FIG. 2A is a layout diagram illustrating a conventional photo-mask pattern used in a process of pattering contact holes for forming contact pads. Referring to FIG. 2A, the photo-mask pattern is a contact type pattern, which has light transmissive regions where contacts are to be formed and light-blocking regions elsewhere. FIG. 2B is a layout diagram illustrating contact holes formed over interlayer insulating layers 20 by using the photo-mask pattern shown in FIG. 2A. Referring to FIG. 2B, only source/drain regions A and B are exposed by the contact holes formed in the interlayer insulating layers 20.

When a conventional photo-mask having a contact type pattern is used in the process of patterning contact holes for forming contact pads, it is possible to directly form contact holes by etching only the necessary parts. Also, it is possible to forego a planarization process, such as chemical mechanical planarization (CMP), after forming an interlayer insulating layer because the light transmissive surface has a small area, thus reducing manufacturing costs and time.

However, it is not easy to use a photo mask having a contact type pattern in an actual process because exposing and etching processes can have limitations when the demand for increased integration requires that the intervals between contact holes be narrow. Especially when the intervals between contact holes and/or the size of contact holes are each less than 160 nm, it is difficult to precisely form contact holes and contact pads because of the limitations of exposing and etching processes. Also, it becomes necessary to conduct a CMP process on the interlayer insulating layer in order to form a fine pattern as the design rule decreases.

Embodiments of the invention address these and other disadvantages of the conventional art.

SUMMARY OF THE INVENTION

Embodiments of the invention provide methods of forming self-aligned contact (SAC) pads of a non-straight type semiconductor memory device in which it is easy to produce a photo-mask, in which the limitations of exposing and etching processes are lessened, and in which it is possible to optimally set an illuminator when forming contact holes using photolithography.

BRIEF DESCRIPTION OF THE DRAWINGS

The above and other features and advantages of the invention will become more apparent by describing in detail exemplary embodiments thereof with reference to the attached drawings that are briefly described below.

DETAILED DESCRIPTION OF THE INVENTION

Figure 1:
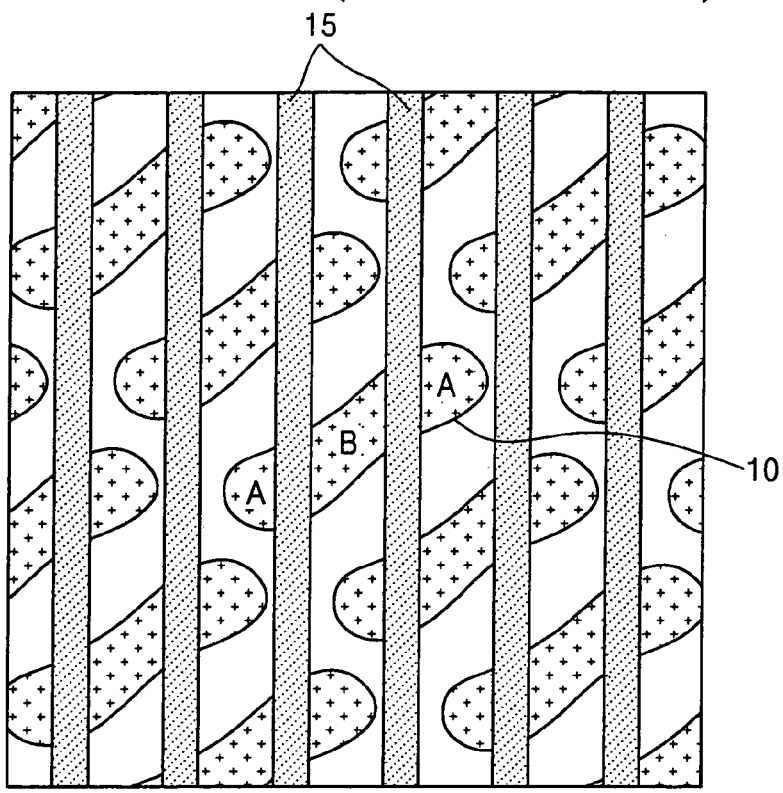
FIG. 1 is a layout diagram illustrating non-straight active regions and gate lines of a conventional semiconductor DRAM device.
Figure 2A:
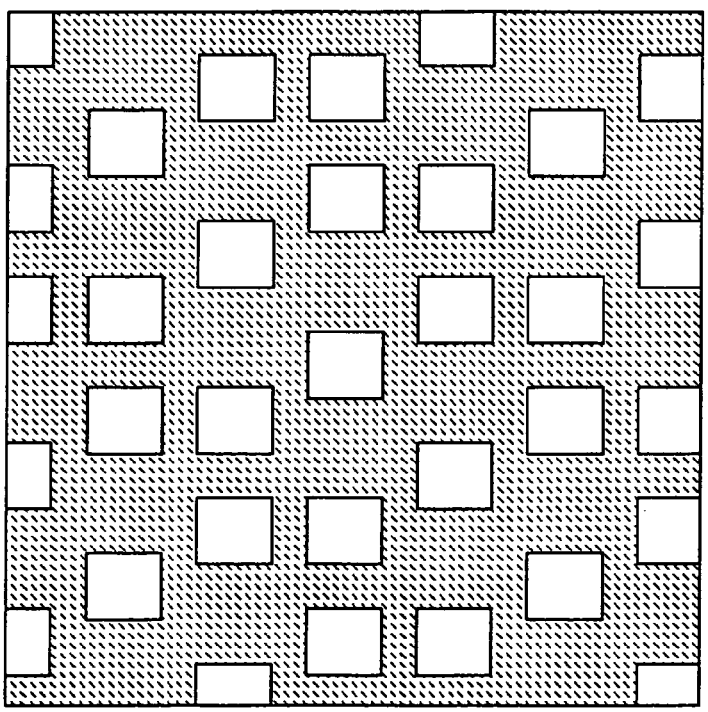
FIG. 2A is a layout diagram illustrating a conventional photo-mask pattern used in a contact hole patterning process for forming contact pads.
Figure 2B:
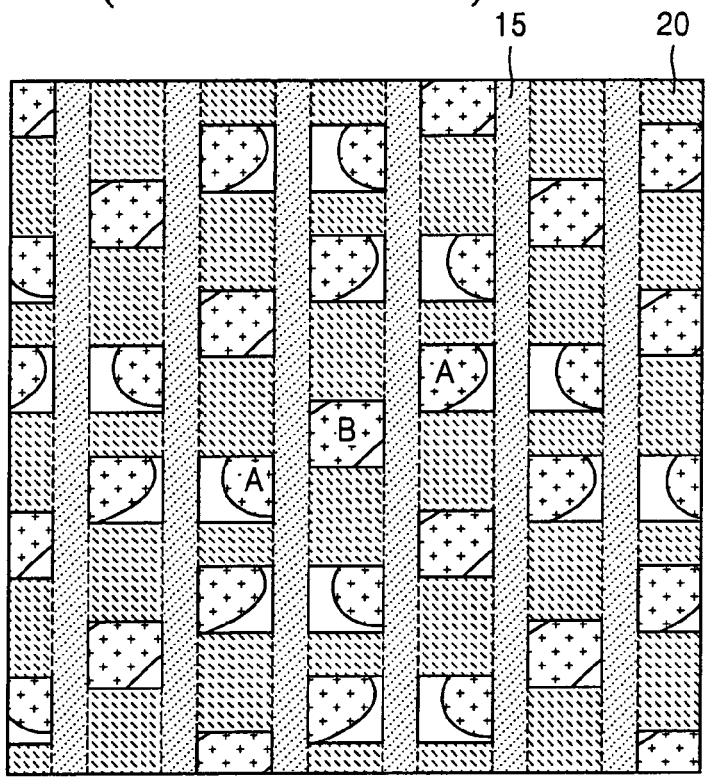
FIG. 2B is a layout diagram illustrating the process of forming contact holes by using the photo-mask pattern shown in FIG. 2A.

A method of forming SAC pads according to some embodiments of the invention is used for non-straight type semiconductor memory devices having non-straight type active regions. As used in the specification, the term "non-straight type semiconductor memory device" may refer to a memory device in which only two memory cells are formed in an isolated active region, and a virtual line connecting the source regions and a common drain region of the two memory cells is not at a right angle to a gate line. The term "non-straight type semiconductor memory device" may also refer to a separate type memory device, in which only one memory cell is formed in an isolated active region and a virtual line connecting the drain regions of two adjacent memory cells, which share a bit line contact, is not at a right angle to a gate line.

Examples of non-straight type active regions of non-straight type semiconductor memory devices include the non-straight type layouts disclosed in U.S. Pat. Nos. 5,194,752, 5,305,252, and 6,031,262. Examples of separate type active regions of separate type semiconductor memory devices are disclosed in Korean Patent Application No. 2003-0056712, entitled "Semiconductor Memory Device Having Mask and Photolithography Affinity and Improved Electric Characteristics," which was filed on 16 Aug. 2003 and shares a common applicant with the present application. Korean Patent Application No. 2003-0056712 is hereby incorporated by reference in its entirety for all purposes.

According to some embodiments of the invention, gate line structures are first formed on a semiconductor substrate having non-straight active regions. When the semiconductor substrate has non-straight type active regions, the gate line structures may be disposed at a predetermined angle to the active regions. On the other hand, when the gate line structures have separate type active regions for each unit cell, the gate line structures may be disposed at a right angle to active regions of a unit cell. An interlayer insulating layer may then be formed on a surface of the semiconductor substrate so as to cover the gate line structures.

A photolithography process may then be performed. In this process, a photo-resist layer is first formed on the interlayer insulating layer. Then, the photo-resist layer is exposed and developed using a photo-mask having a bar type pattern, thus forming a photo-resist layer pattern. The bar type pattern refers to a pattern of light-blocking regions of a photo-mask that has a plurality of bar-shaped regions arranged in rows. The bar type pattern of a photo-mask is employed to form contact pads directly connected to source/drain regions and a self-aligned etching process is used.

The photolithography process is finished by forming contact holes that expose source/drain regions of the non-straight type active regions by etching the interlayer insulating layer using the photo-resist layer pattern as an etching mask. Then, contact pads connected with the source/drain regions are completed by filling the contact holes with a conductive material.

According to some other embodiments of the invention, gate line structures are first formed on a substrate of a semiconductor having non-straight active regions. When the semiconductor substrate has non-straight type active regions, the gate line structures may be disposed at a predetermined angle to the active regions. On the other hand, when the semiconductor substrate has separate type active regions for each unit cell, the gate line structures may be disposed at right angles to active regions of a unit cell. An interlayer insulating layer may then be formed on a surface of the semiconductor substrate so as to cover the gate line structures.

A photolithography process may then be performed. In this process, a photo-resist layer is first formed on the interlayer insulating layer. Then, the photo-resist layer is exposed and developed using a photo-mask having a wave type pattern, thus forming a photo-resist pattern. The wave type pattern refers to a pattern of light-blocking regions of a photo-mask that has a plurality of wave-shaped regions. In this photo-mask, light transmissive regions correspond to at least active regions of the semiconductor substrate. The wave type pattern of a photo-mask is employed to form contact pads directly connected with source/drain regions and a self-aligned etching process is used.

The photolithography process is finished by forming contact holes that expose source/drain regions of the non-straight type active regions by etching the interlayer insulating layer using the photo-resist pattern as an etching mask. Then, the contact holes are filled with a conductive material to complete contact pads that are connected with the source/drain regions.

According to still other embodiments of the invention, gate line structures are first formed on a substrate of a semiconductor having non-straight type active regions. When the semiconductor substrate has non-straight type active regions, the gate line structures may be disposed at a predetermined angle to the active regions. On the other hand, when the semiconductor substrate has separate type active regions for each unit cell, the gate line structures may be formed at right angles to active regions of a unit cell. An interlayer insulating layer may then be formed on a surface of the semiconductor substrate so as to cover the gate line structures.

A photolithography process may then be performed. In this process, a photo-resist layer is first formed on the interlayer insulating layer. Then, the photo-resist layer is exposed and developed using a photo-mask having a reverse active type pattern, thus forming a photo-resist pattern. The reverse active type pattern refers to a pattern of light-blocking regions of a photo-mask that is shaped like the rest of parts except active regions. That is, the pattern of light transmissive regions in the photo-mask is almost same as that of active regions. In this photo-mask, light transmissive regions expose at least active regions of a semiconductor substrate.

The photolithography process is finished by forming contact holes that expose source/drain regions of the non-straight type active regions by etching the interlayer insulating layer using the photo-resist pattern as an etching mask. Then, the contact holes are filled with a conductive material to complete contact pads that are connected with the source/drain regions.

In the paragraphs that follow, the invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals throughout the specification denote like elements.

Figure 3A:
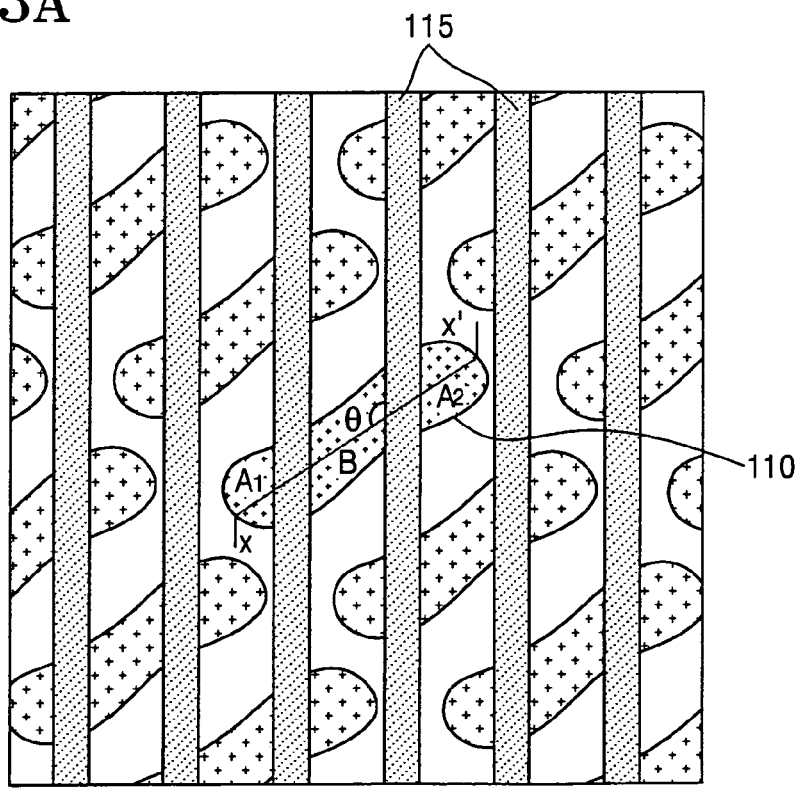
FIG. 3A is a layout diagram illustrating examples of non-straight active regions and gate lines of a semiconductor DRAM device.
Figure 3B:
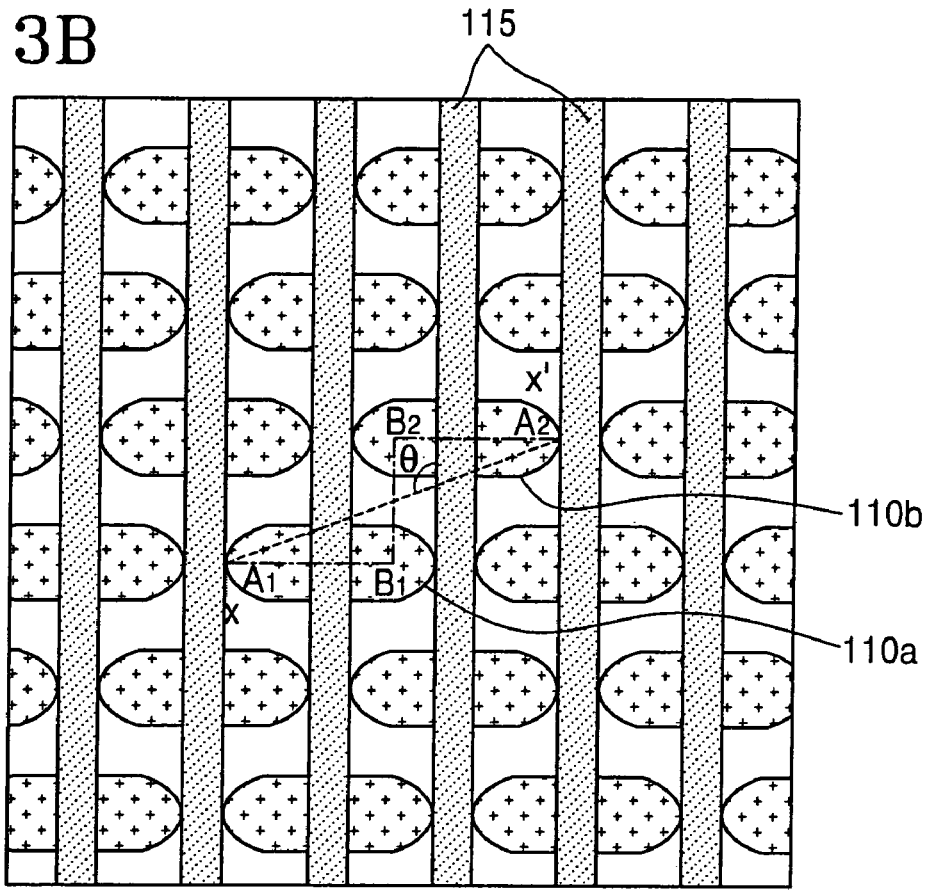
FIG. 3B is a layout diagram illustrating examples of separate type non-straight active regions and gate lines of a semiconductor DRAM device.

FIGS. 3A and 3B are layout diagrams illustrating active regions and gate line structures of a semiconductor memory device having non-straight type active regions that can be formed using a method of manufacturing self-aligned contact (SAC) pads according to some embodiments of the invention. FIG. 3A illustrates non-straight type active regions. FIG. 3B illustrates separate type active regions.

Referring to FIG. 3A, a line X–X' that approximately bisects the non-straight type active region 110 is not orthogonal to gate line structures 115. That is, an angle θ formed by the line X–X' and the gate line structure 115 is not 90°, but can be less than or greater than 90°.

As shown in FIG. 3B, the mid-point of a line X–X' connecting source regions $A_1$ and $A_2$ intersects the mid-point of a line connecting drain regions $B_1$ and $B_2$ of separate type active regions 100a and 110b. The drain regions $B_1$ and $B_2$ are separated from each other but share a bit line contact pad. That is, the drain regions $B_1$ and $B_2$ that are separated from each other by the common bit line contact pads are connected by bit lines. The line X–X' connecting the source region $A_1$ and the source region $A_2$ of the separate type active regions is the same as the line X–X' of FIG. 3A.

FIGS. 4A through 4D are cross-sectional diagrams taken allowing the line X–X' of FIG. 3A or 3B that illustrate a method of forming SAC pads of a non-straight type semiconductor device according to some embodiments of the invention.

Figure 4A:
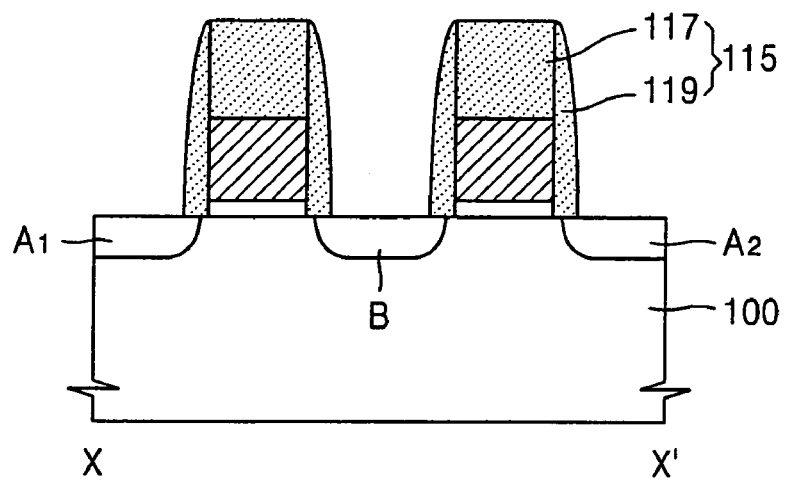
FIGS. 4A, 4B, 4C, and 4D are cross-sectional diagrams illustrating a method of manufacturing self-aligned contact (SAC) pads of a non-straight type semiconductor memory device according to some embodiments of the invention.

Referring to FIG. 4A, gate line structures 115 and source/drain regions $A_1$, B, and $A_2$ are formed in a semiconductor substrate 100 using a conventional method. The gate line structure 115 includes a hard mask 117 on the upper part of the gate line structure and a spacer 119 forming the sidewall of the gate line structure. The hard mask 117 and the spacer 119 can be composed of materials having a high etch selectivity with respect to an interlayer insulating layer in order to use a SAC pad forming process. For example, the hard mask 117 and the spacer 119 can be composed of silicon nitride when the interlayer insulating layer is composed of silicon oxide. The source/drain regions $A_1$, B, and $A_2$ can form a lightly doped drain (LDD) structure.

Figure 4B:
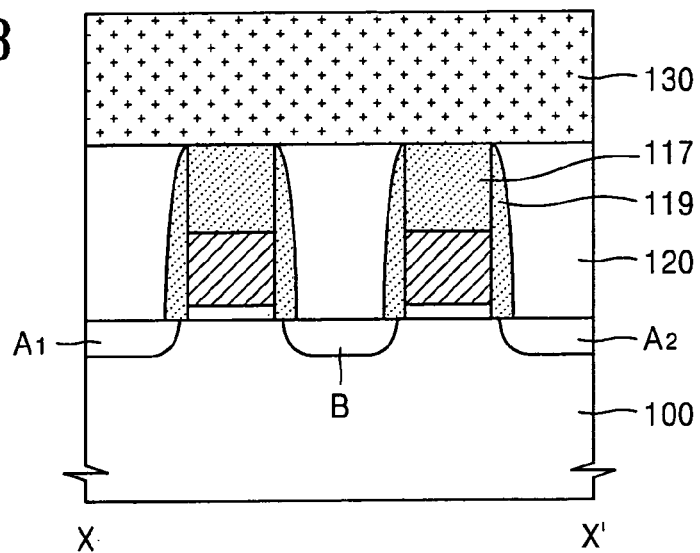

Referring to FIG. 4B, an interlayer insulating layer 120 is formed over the structure illustrated in FIG. 4A. The interlayer insulating layer 120 can be composed of silicon oxide. When forming the interlayer insulating layer 120, silicon oxide can be deposited up to the upper part of the gate electrode structures 115 and then planarized using CMP, a dry etch back process, etc. The thickness of the interlayer insulating layer 120 can be equal to or greater than that of the gate electrode structures 115. Then, a photo-resist layer 130 is coated on the interlayer insulating layer 120 to a predetermined thickness.

Figure 4C:
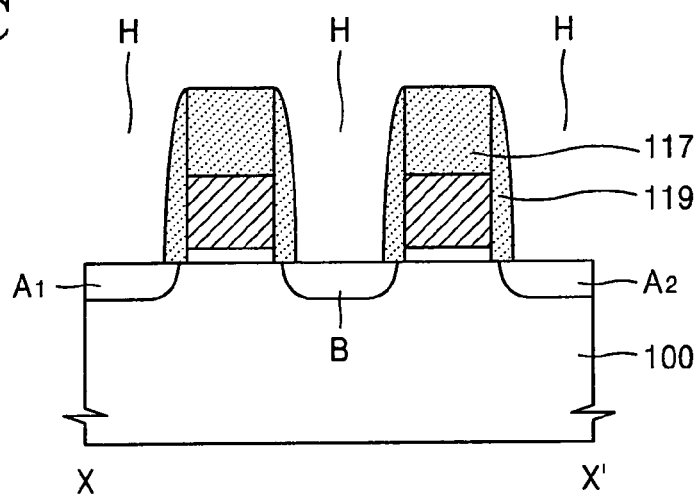
Figure 4D:
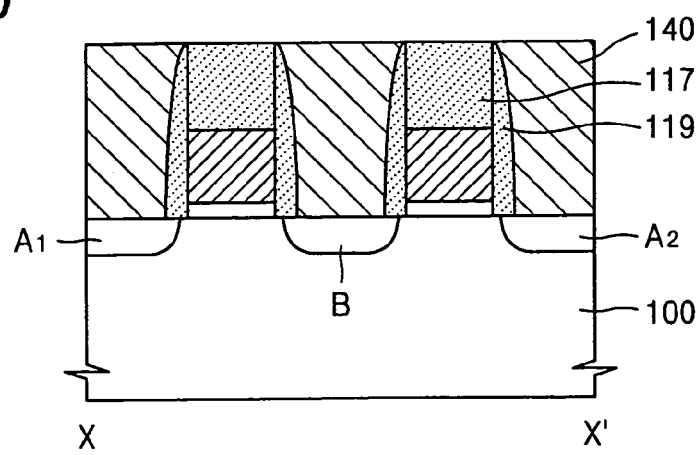

Referring to FIG. 4C, a photo-resist pattern is formed using exposing and developing processes.

Figure 5A:
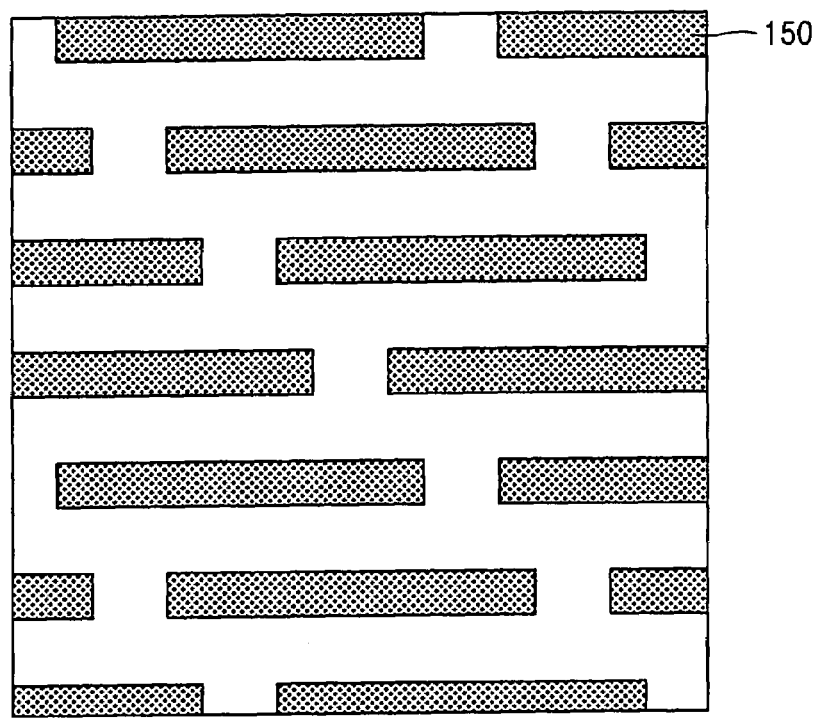
FIG. 5A is a layout diagram illustrating a photo-mask having a bar type pattern.
Figure 6A:
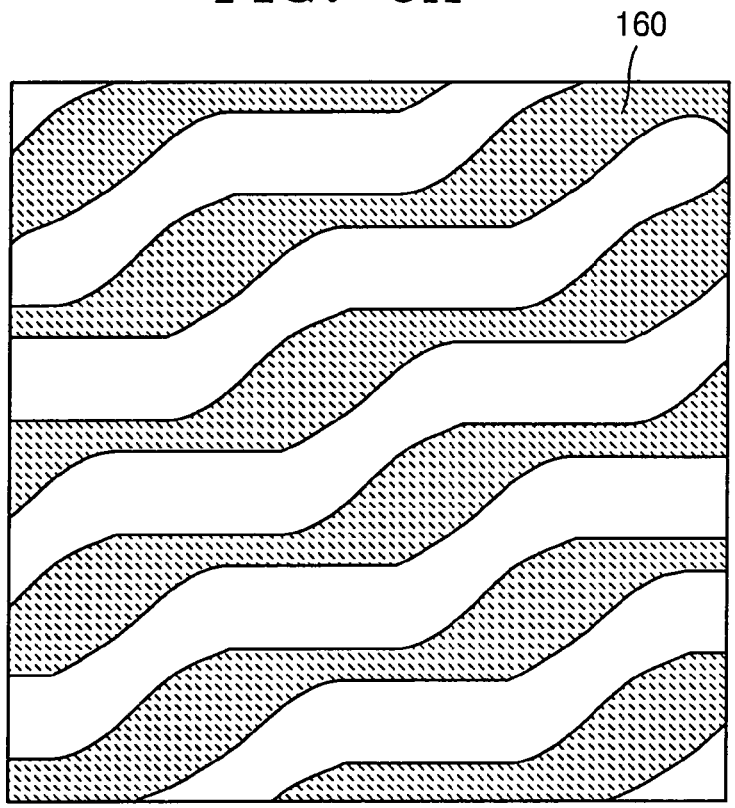
FIG. 6A is a layout diagram illustrating a photo-mask having a wave type pattern.
Figure 7A:
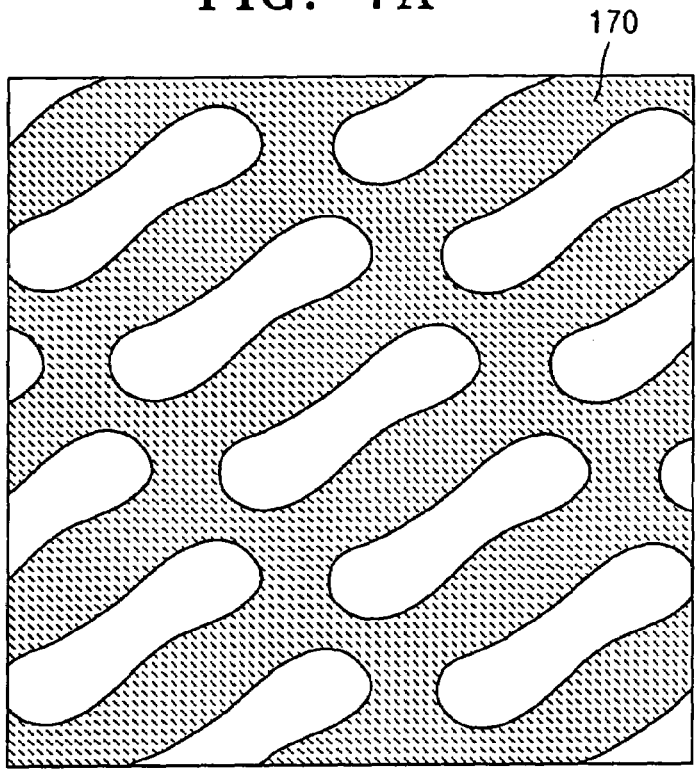
FIG. 7A is a layout diagram illustrating a photo-mask having an active type pattern.

FIGS. 5A, 6A, and 7A illustrate some examples of photo-mask patterns that may be used for the exposing and developing processes according to some embodiments of the invention.

FIGS. 5B, 5D, 6B, and 7D are layout diagrams illustrating photo-resist patterns formed by the exposing and developing processes.

FIG. 5A illustrates a photo-mask having a bar type pattern 150. Referring to FIG. 5A, the photo-mask has a plurality of bar type light-blocking patterns 150 each having a predetermined width and length. For example, the bar type light blocking patterns 150 may have a length of about 3 times the pitch of the gate line to about 4 times the pitch of the gate line. The bar type light-blocking patterns 150 are arranged such that each subsequent row of patterns is shifted with respect to the previous row.

It is much easier to manufacture a photo-mask when a bar type photo-mask pattern, such as the bar-type photo mask patterns 150, is used because it is possible to manufacture a relatively large photo-mask and make the whole contours straight lines. Also, a di-pole or a cross-pole shaped aperture for an off-axis illuminator can be used in the exposing process, thus resulting in excellent exposure characteristics.

Also, according to embodiments of the invention, the bar type light-blocking patterns may each have an OPC (Optical Proximity Correction) pattern in order to offset the optical proximity effect of the bar type light-blocking patterns. For example, it is possible to prevent the optical proximity effect by making the width of the both ends of the bar pattern greater and/or making the width of the center of the bar pattern greater.

Figure 5B:
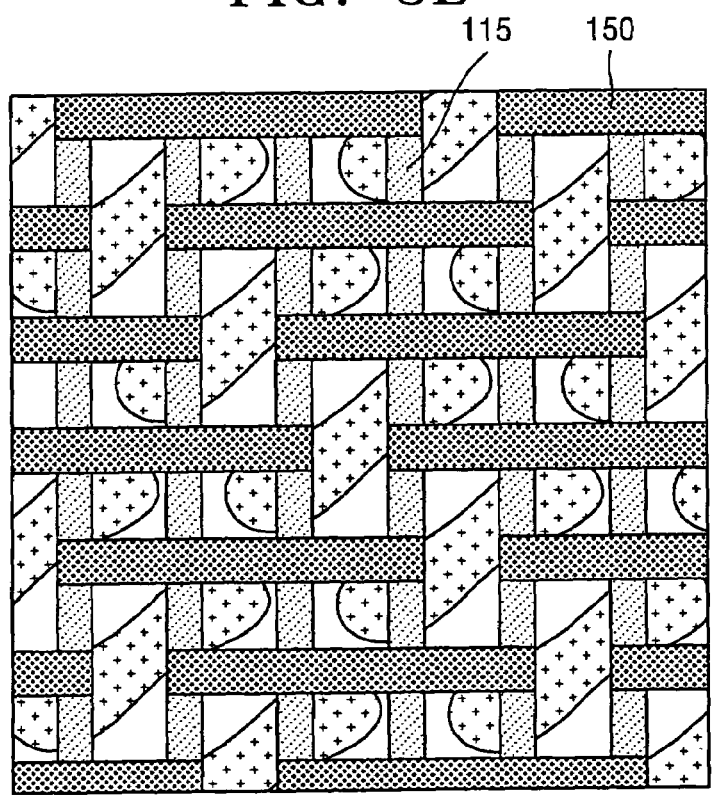
FIG. 5B is a layout diagram illustrating the process of forming contact holes of a non-straight type semiconductor memory device by using the photo-mask pattern shown in FIG. 5A.
Figure 5C:
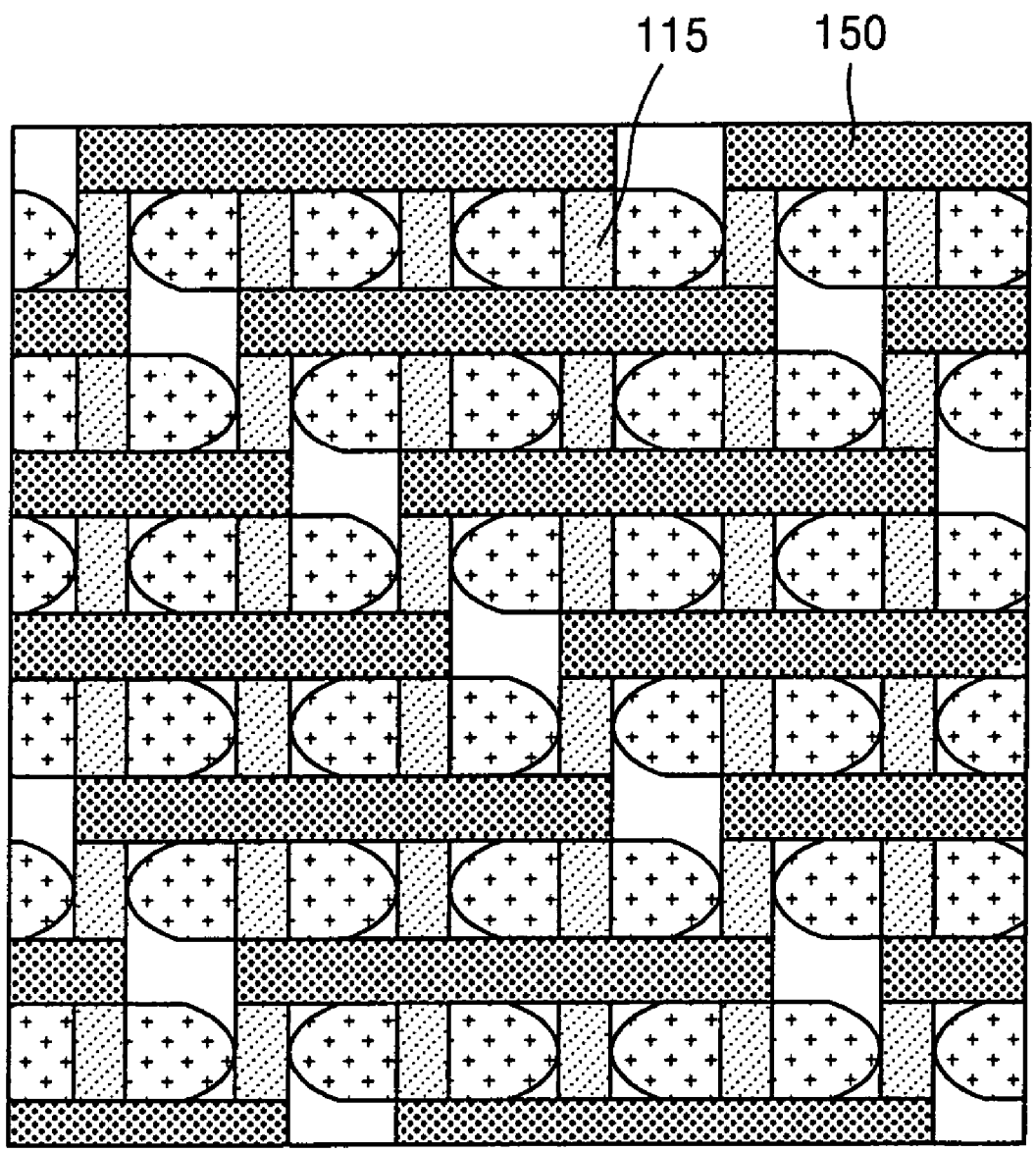
FIG. 5C is a layout diagram illustrating the process of forming contact holes of a separate type semiconductor memory device by using the photo-mask pattern shown in FIG. 5A.

FIG. 5B is a layout diagram illustrating the photo-mask of FIG. 5A and a semiconductor device having non-straight type active regions. FIG. 5C is a layout diagram illustrating the photo-mask of FIG. 5A and a semiconductor device having separate type active regions. With reference to FIGS. 5B and 5C, the bar type patterns are disposed at right angles to the gate line structures in the exposing process. Thus, a photo-resist pattern is a bar type as shown.

Figure 5D:
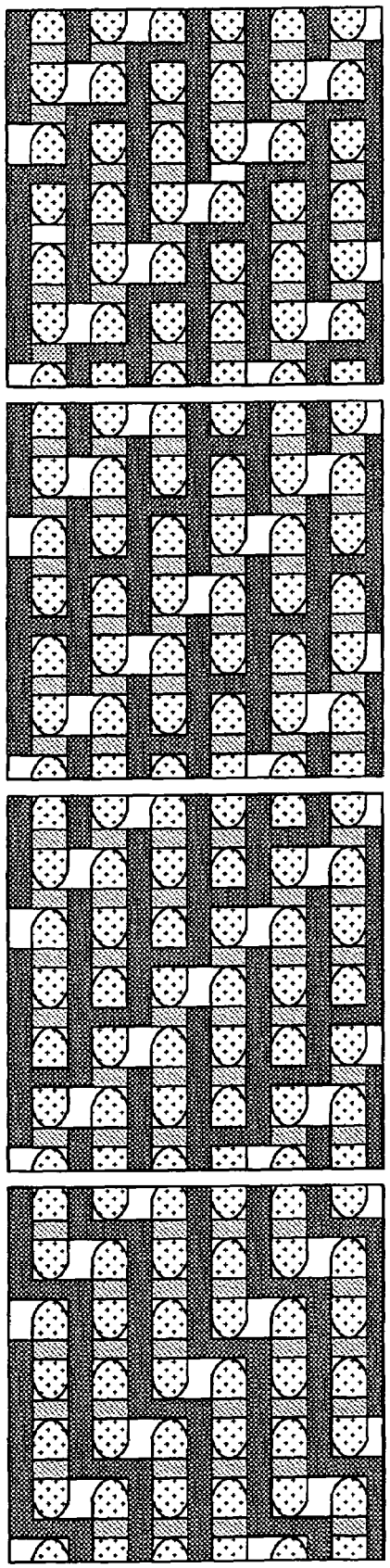
FIG. 5D is a layout diagram illustrating photo-masks having bar type patterns.

FIG. 5D is a layout diagram illustrating photo-masks having bar type patterns, each bar-type pattern having a connecting part that interconnects adjacent patterns, and the alignment of the photo-masks with respect to a semiconductor device having separate type active regions. The connecting part may intersect gate line structures or device isolating regions so as to form contact holes in source/drain regions of a semiconductor substrate. Additionally, forming such a connecting part can prevent a photo-resist pattern from collapsing due to the decrease of a design rule.

FIG. 6A is a layout diagram illustrating a photo-mask having a wave type pattern 160. Referring to FIG. 6A, the photo mask has a plurality of wave type light-blocking patterns 160 each having a predetermined width. The widths of the wave type light-blocking patterns 160 can vary according to their locations. The wave type light-blocking patterns 160 are shifted by regular amounts according to the arrangement of active regions. The wave type photo-mask according to an embodiment is easier to manufacture than a contact type photo-mask.

Figure 6B:
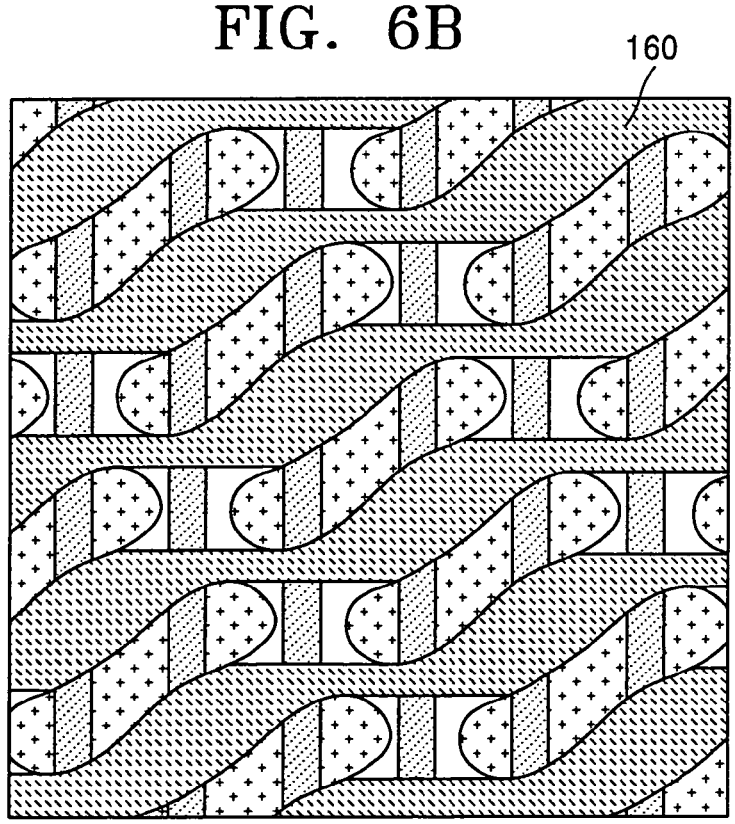
FIG. 6B is a layout diagram illustrating the process of forming contact holes of a non-straight type semiconductor memory device by using the photo-mask pattern shown in FIG. 6A.

FIG. 6B is a layout diagram illustrating the photo-mask of FIG. 6A with respect to a semiconductor device having non-straight type active regions. Referring to FIG. 6B, a photo-resist pattern exposes active regions and device isolation regions adjacent to the active regions.

Figure 7B:
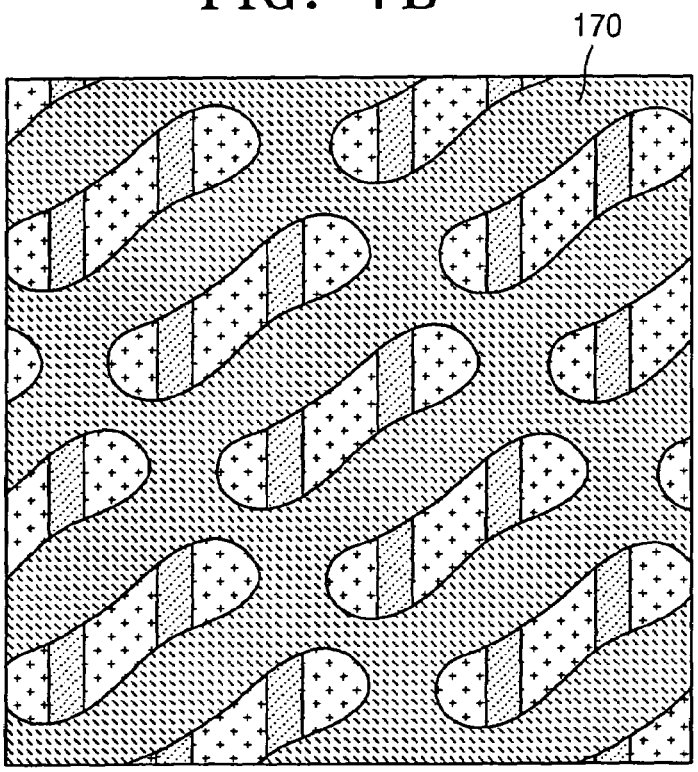
FIG. 7B is a layout diagram illustrating the process of forming contact holes of a non-straight type semiconductor memory device by using the photo-mask pattern shown in FIG. 7A.

FIG. 7A shows a photo-mask having a reverse active type pattern 170. The reverse active type pattern 170 can be used for a semiconductor device having non-straight type active regions. Referring to FIG. 7A, the photo-mask has a pattern in which only the parts corresponding to active regions are light transmissive regions and the remaining portions are light-blocking regions. A photo-resist pattern 170 formed using the reverse active type photo-mask also exposes the source/drain regions and gate line structures located between source/drain regions. In light transmissive regions of a reverse active type photo-mask, the parts corresponding to source/drain regions form one unit, thus making it easier to manufacture than a contact type photo-mask. FIG. 7B is a layout diagram illustrating the photo-mask of FIG. 7A with respect to a semiconductor device having non-straight type active regions.

Thus, the photo-resist layer 130 of FIG. 4B may be exposed and developed using one of the photo-masks illustrated in FIGS. 5A, 6A, 7A to form a photo-resist pattern that will be used as an etching mask. The photo-mask that is used may have another desired shape besides those shown in FIGS. 5A, 6A, and 7A.

Referring to FIG. 4C, the interlayer insulating layer 120 is etched by using a photo-resist pattern as an etching mask. A dry etching method using plasma may be employed for the etching process. As a result of the etching process, contact holes H exposing source/drain regions $A_1$, B, and $A_2$ as shown are formed over an interlayer insulating layer.

Referring to 4D, contact pads 140 are formed by filling the contact holes H with a conductive material.

In the process of forming the contact pads 140, a conductive material is deposited in order to fill the contact holes H and is then planarized using a process such as CMP, dry etch back, etc., in order to separate each contact pad from the other. The conductive material may be, for example, doped polysilicon, a metal, a metal silicide, or a combination of these materials. The hard mask 117 may be set as the end point for the etching process.

Thus, according to embodiments of the invention, a method of forming SAC pads of a non-straight type semiconductor memory device involves the use of a photo-mask that is easy to manufacture, thus shortening processing time and improving the refinement of a pattern due to improved characteristics of exposing and developing processes.

According to embodiments of the invention, it is possible to sufficiently secure an alignment allowance of an exposing process in spite of the refinement of a contact hole pattern. This is especially true when a bar type pattern photo-mask is used, making it possible to use an optimized illuminator, thus preventing the manufacturing of inferior goods caused by formation of an inaccurate pattern.

Although the specification may refer to "an", "one", "another", or "some" embodiment(s) in several locations, this does not necessarily mean that each such reference is to the same embodiment(s), or that the feature only applies to a single embodiment.

The preceding embodiments are exemplary. Those of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure. Such alternative implementations are encompassed within the embodiments of the invention, and are intended to fall within the scope of the attached claims.

We claim:

1. A method comprising:
   forming gate line structures extending in one direction on a semiconductor substrate having non-straight type active regions;
   covering the gate line structures with an interlayer insulating layer;
   forming a photo-resist layer on the interlayer insulating layer;
   exposing and developing the photo-resist layer with a photo-mask having bar type patterns to form a photo-resist pattern, the bar type patterns extending at right angles to the gate line structures, the length of the bar type patterns from 3 times the pitch of the gate line structures to 4 times the pitch of the gate line structures;
   etching the interlayer insulating layer using the photo-resist pattern as an etching mask to form contact holes exposing source/drain regions of the non-straight type active regions; and
   filling the contact holes with a conductive material to form contact pads.

2. The method of claim 1, wherein the non-straight type active regions are separate type active regions.

3. The method of claim 1, wherein the adjacent bar type patterns of the extension direction of the gate line structures are shifted by the pitch of the gate line structures.

4. A method of forming self aligned contact pads of a non-straight semiconductor memory device, the method comprising:
   forming a plurality of gate line structures on a semiconductor substrate having non-straight active regions;
   forming an interlayer insulating layer covering the gate line structures and the semiconductor substrate;
   forming a photo-resist layer on the interlayer insulating layer;
   forming a photo-resist pattern by exposing and developing the photo-resist layer with a photo-mask having wave type patterns;
   forming contact holes exposing source/drain regions of the non-straight type active regions by etching the interlayer insulating layer using the photo-resist pattern as an etching mask; and
   forming contact pads by filling the contact holes with a conductive material.

5. The method of claim 4, wherein the wave type patterns expose at least the non-straight active regions.

6. The method of claim 5, wherein the non-straight active regions are separate type active regions.

7. The method of claim 5, wherein the wave type patterns further comprise an OPC pattern preventing an optical proximity effect.

8. A method comprising:
   forming active regions on a semiconductor substrate, a major axis of each of the active regions aligned parallel to a first direction;
   forming gate line structures on the semiconductor substrate, the gate line structures aligned parallel to a second direction, an angle between the first and second directions not equal to a right angle;
   covering the gate line structures with an interlayer insulating layer;
   forming a photo-resist layer on the interlayer insulating layer;
   exposing and developing the photo-resist layer with a photo-mask to form a photo-resist pattern;
   etching the interlayer insulating layer using the photo-resist pattern as an etching mask to form contact holes exposing source/drain regions of the active regions; and
   filling the contact holes with a conductive material to form contact pads.

9. The method of claim 8, wherein forming active regions comprises forming active regions that each have only two source regions and only one drain region.

10. The method of claim 8, wherein forming active regions comprises forming active regions that each have only one source region and only one drain region.

11. The method of claim 8, wherein exposing and developing the photo-resist layer with a photo-mask comprises exposing and developing the photo-resist layer with a photo-mask that has bar-type patterns.

12. The method of claim 8, wherein exposing and developing the photo-resist layer with a photo-mask comprises exposing and developing the photo-resist layer with a photo-mask that has wave-type patterns.

13. The method of claim 8, wherein exposing and developing the photo-resist layer with a photo-mask comprises exposing and developing the photo-resist layer with a photo-mask that has reverse active-type patterns.

14. A method comprising:
   forming gate line structures extending in one direction on a semiconductor substrate having non-straight type active regions;
   covering the gate line structures with an interlayer insulating layer;
   forming a photo-resist layer on the interlayer insulating layer;
   exposing and developing the photo-resist layer with a photomask having bar type patterns to form a photo-resist pattern, the bar-type patterns including connecting patterns, the connecting patterns interconnecting adjacent bar type patterns to each other;
   etching the interlayer insulating layer using the photo-resist pattern as an etching mask to form contact holes exposing source/drain regions of the non-straight type active regions; and
   filling the contact holes with a conductive material to form contact pads.

15. A method comprising:
   forming gate line structures extending in one direction on a semiconductor substrate having non-straight type active regions;
   covering the gate line structures with an interlayer insulating layer;
   forming a photo-resist layer on the interlayer insulating layer;
   exposing and developing the photo-resist layer with a photo-mask having bar type patterns to form a photo-resist pattern, the bar type patterns including an OPC pattern for preventing an optical proximity effect;
   etching the interlayer insulating layer using the photo-resist pattern as an etching mask to form contact holes exposing source/drain regions of the non-straight type active regions; and
   filling the contact holes with a conductive material to form contact pads.

* * * * *